United States Patent
Ohba et al.

(10) Patent No.: US 9,215,122 B2
(45) Date of Patent: Dec. 15, 2015

(54) RADIO COMMUNICATION APPARATUS AND INTERFERENCE SIGNAL DETECTION METHOD

(71) Applicant: Panasonic Corporation, Osaka (JP)

(72) Inventors: Makoto Ohba, Osaka (JP); Kouji Takahashi, Shiga (JP); Yoshito Hirai, Osaka (JP)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 14/626,934

(22) Filed: Feb. 20, 2015

(65) Prior Publication Data
US 2015/0256374 A1 Sep. 10, 2015

(30) Foreign Application Priority Data
Mar. 5, 2014 (JP) ................................ 2014-042638

(51) Int. Cl.
*H04B 1/10* (2006.01)
*H04L 25/08* (2006.01)
*H04L 27/26* (2006.01)

(52) U.S. Cl.
CPC ................ *H04L 27/265* (2013.01); *H04B 1/10* (2013.01); *H04B 1/1027* (2013.01); *H04L 25/08* (2013.01)

(58) Field of Classification Search
CPC .................. H04B 1/10; H04B 1/1027; H04B 2001/1072; H04L 27/2647; H04L 27/265; H04L 27/2691; H04L 25/08; H03D 2200/0088
USPC ............... 375/260, 344, 345, 346; 455/192.1, 455/192.2, 255, 257, 295
See application file for complete search history.

(56) References Cited

U.S. PATENT DOCUMENTS

| | | | | |
|---|---|---|---|---|
| 5,001,776 A | * | 3/1991 | Clark | H04B 1/109 455/226.2 |
| 8,428,535 B1 | * | 4/2013 | Cousinard | A42B 3/225 455/226.2 |
| 8,744,021 B1 | * | 6/2014 | Gurney | H04B 1/1027 375/316 |
| 2009/0124228 A1 | | 5/2009 | Ishiguro | |
| 2013/0003902 A1 | * | 1/2013 | Kawai | H04N 5/52 375/345 |

FOREIGN PATENT DOCUMENTS

| | | |
|---|---|---|
| JP | 2009-111848 | 5/2009 |
| JP | 2013-026970 | 2/2013 |

* cited by examiner

*Primary Examiner* — Betsy Deppe
(74) *Attorney, Agent, or Firm* — Seed IP Law Group PLLC

(57) ABSTRACT

Until when a desired signal is received in a reception mode, a level comparator extracts a portion of a frequency-domain signal output from a Fourier transformer, the portion matching with the frequency of the desired signal, and, when the reception level of the extracted portion matching with the frequency of the desired signal is higher than a predetermined threshold value, determines that an interference signal exists. An LO frequency controller sets the frequency of a local signal (LO) based on the determination result in the level comparator such that the frequency of intermodulation distortion caused by the interference signal becomes an intermediate frequency of the frequency band of the desired signal. When it is determined that the interference signal exists, an RX controller changes gain settings of a low-noise amplifier circuit and gain settings of a variable gain amplifier circuit and changes the cutoff frequency of a filter circuit.

4 Claims, 4 Drawing Sheets

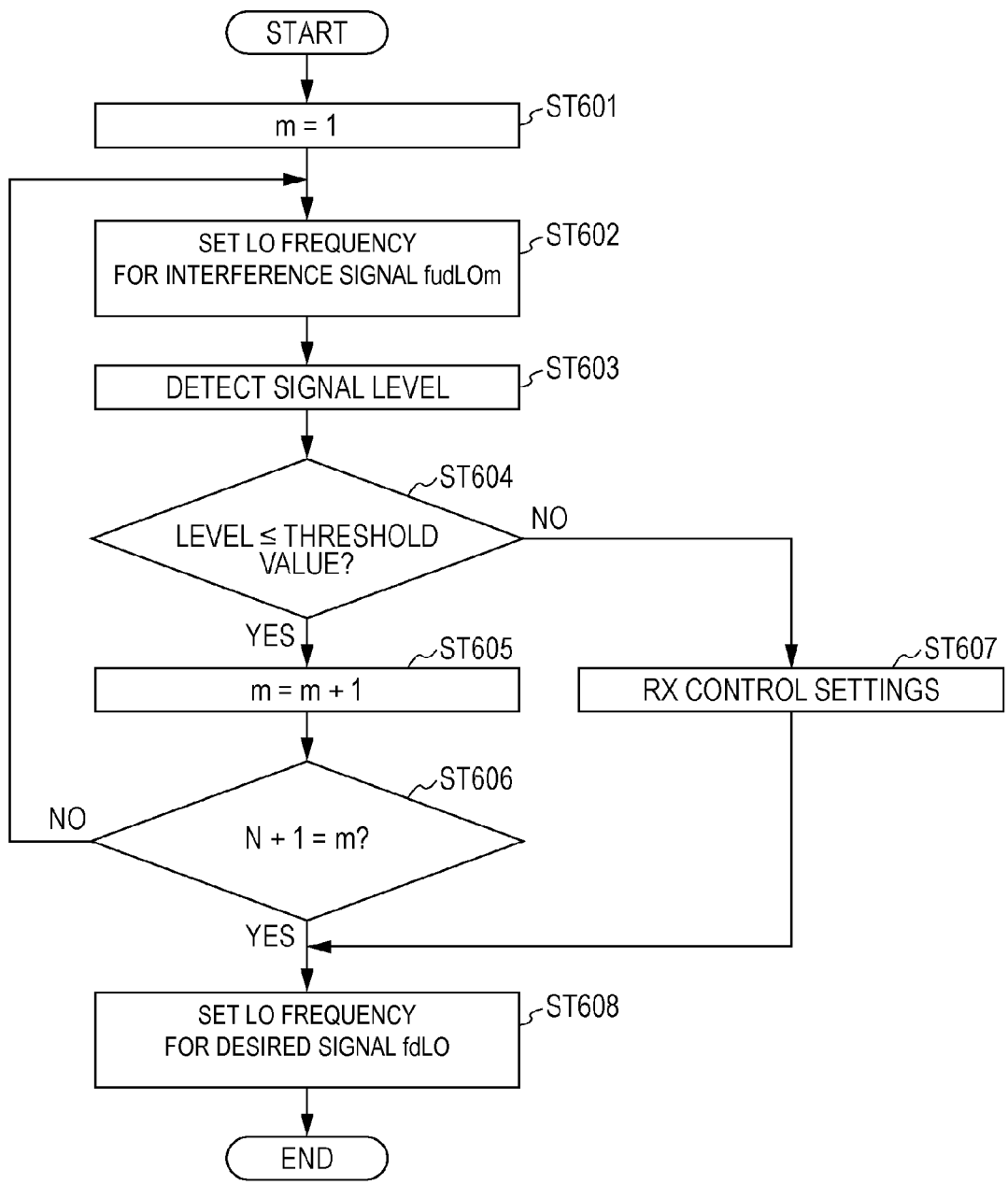

RADIO COMMUNICATION APPARATUS AND INTERFERENCE SIGNAL DETECTION METHOD

BACKGROUND

1. Technical Field

The present disclosure relates to radio communication apparatuses and interference signal detection methods.

2. Description of the Related Art

In recent years, the range of uses to which wireless sensor networks is put has been expanded to include smart meters, home energy management systems (HEMS), medical care, social infrastructures, and so forth and has attracted attention. For example, in Japan, the 920 MHz band is assigned as the industry-science-medical (ISM) band, and the user can perform wireless sensor networks by using this frequency band without the need for a license.

The 920 MHz band is present near the 800 MHz band and the 900 MHz band which are assigned as the radio waves for mobile telephones. In particular, the frequency band from 945 MHz to 960 MHz is assigned for LTE communication and a signal formed of a plurality of OFDM modulated subcarriers is transmitted therein. There is a high possibility that, depending on the combination of the frequencies of these subcarriers, odd-order intermodulation distortion such as third-order intermodulation distortion or fifth-order intermodulation distortion occurs near the 920 MHz band and becomes an interference signal.

As described above, in the radio communication, the intermodulation distortion of the radio wave used in other communications may act as an interference signal and cause significant degradation in reception performance.

In Japanese Unexamined Patent Application Publication No. 2009-111848, as a method for detecting and removing an interference signal, a method by which a desired signal is removed by a notch filter and then an interference signal is detected has been proposed. Moreover, in Japanese Unexamined Patent Application Publication No. 2013-26970, a circuit that detects an interference signal having signal strength which is higher than or equal to predetermined signal strength has been proposed.

SUMMARY

However, since a notch filter was added in Japanese Unexamined Patent Application Publication No. 2009-111848 and an interference signal detection circuit was added in Japanese Unexamined Patent Application Publication No. 2013-26970, the circuit size is undesirably increased in both cases.

One non-limiting and exemplary embodiment provides a radio communication apparatus and an interference signal detection method which can detect an interference signal without an increase in circuit size.

In one general aspect, the techniques disclosed here feature a radio communication apparatus including: a mixer that generates an analog signal of an intermediate frequency by mixing a local signal having a frequency with an analog signal of a radio frequency; an analog-to-digital converter that converts the generated analog signal of the intermediate frequency into a digital signal in a time-domain; a Fourier transformer that transforms the digital signal in the time-domain into a frequency-domain signal; a level comparator that until when a desired signal is received in a reception mode, extracts a portion of the frequency-domain signal output from the Fourier transformer, the portion matching with the frequency of the desired signal, compares the reception level of the extracted portion with a threshold value, and determines whether or not an interference signal exists based on the comparison result; and an LO frequency controller that sets the frequency of the local signal based on the determination result such that a frequency of intermodulation distortion caused by the interference signal becomes an intermediate frequency of the frequency band of the desired signal, wherein the local signal of the frequency set by the LO frequency controller is output to the mixer during the reception mode.

According to the present disclosure, it is possible to detect an interference signal without an increase in circuit size.

It should be noted that general or specific embodiments may be implemented as a system, a method, an integrated circuit, a computer program, a storage medium, or any selective combination thereof.

Additional benefits and advantages of the disclosed embodiments will become apparent from the specification and drawings. The benefits and/or advantages may be individually obtained by the various embodiments and features of the specification and drawings, which need not all be provided in order to obtain one or more of such benefits and/or advantages.

BRIEF DESCRIPTION OF THE DRAWINGS

FIG. 6 is a flow diagram depicting the flow of preliminary processing of the radio communication apparatus according to the embodiment of the present disclosure.

DETAILED DESCRIPTION

Figure 1:
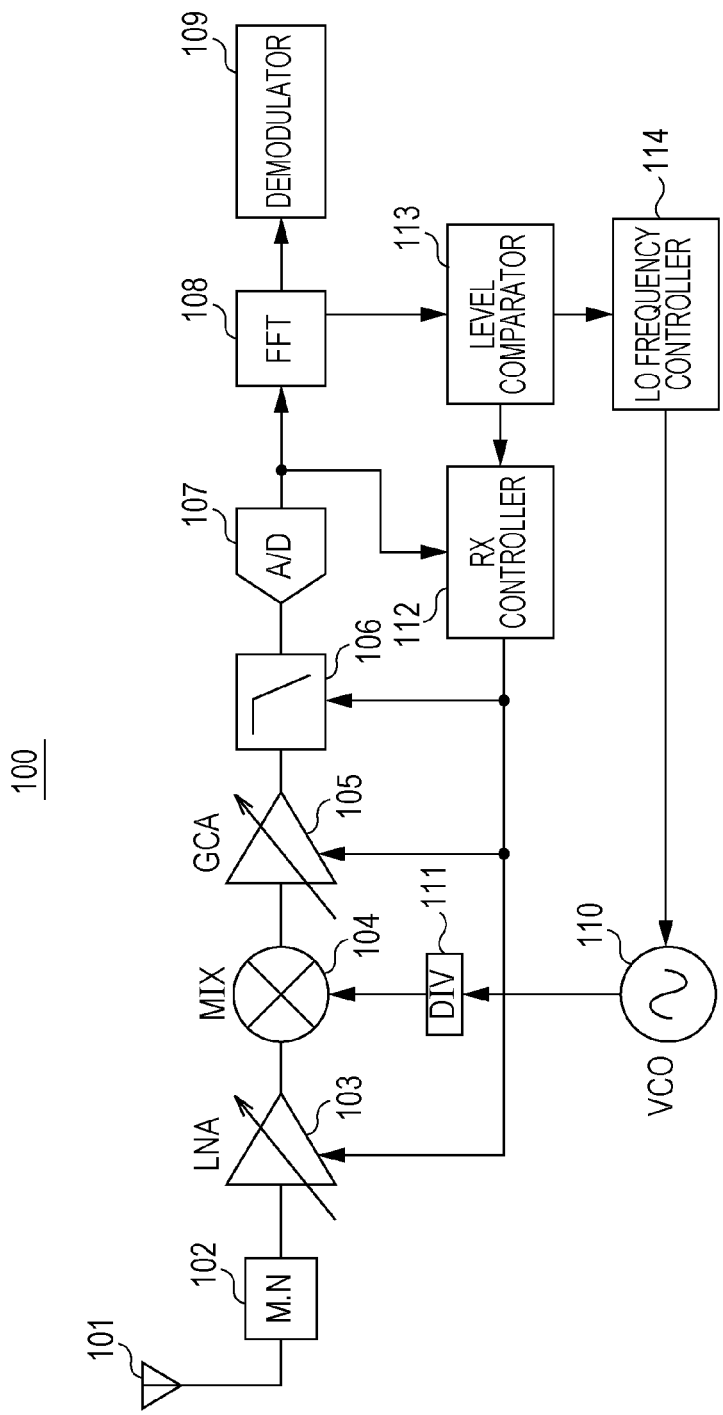
FIG. 1 is a block diagram depicting the configuration of a radio communication apparatus according to an embodiment of the present disclosure.

Hereinafter, an embodiment of the present disclosure will be described in detail with reference to the drawings. FIG. 1 is a block diagram depicting the configuration of a radio communication apparatus according to this embodiment.

As depicted in FIG. 1, a radio communication apparatus (receiver) 100 is formed mainly of an antenna 101, a matching circuit (M.N) 102, a low-noise amplifier circuit (LNA) 103, a mixer circuit (MIX) 104, a variable gain amplifier circuit (GCA) 105, a filter circuit 106, an A/D converter circuit 107, a fast Fourier transform circuit (FFT) 108, a demodulator 109, a voltage control transmitter (VCO) 110, a frequency divider circuit (DIV) 111, an RX controller 112, a level comparator 113, and an LO frequency controller 114.

The matching circuit 102 performs impedance matching on an analog signal of a radio frequency, the analog signal received by the antenna 101, and removes a harmonic component. The low-noise amplifier circuit 103 performs variable amplification on the analog signal of the radio frequency, the analog signal output from the matching circuit 102, based on the control performed by the RX controller 112.

The mixer circuit 104 performs down-conversion (frequency conversion) on the analog signal of the radio frequency, the analog signal output from the low-noise amplifier circuit 103, by mixing a local signal subjected to frequency division by the frequency divider circuit (DIV) 111 into the analog signal and generates an analog signal of an intermediate frequency. The variable gain amplifier circuit 105 performs variable amplification on the analog signal output from the mixer circuit 104 based on the control performed by the RX controller 112. The filter circuit 106 removes a radio-frequency component from the analog signal output from the variable gain amplifier circuit 105 by a pass band based on the control performed by the RX controller 112.

The A/D converter circuit 107 converts the analog signal output from the filter circuit 106 into a digital signal (a baseband signal). The fast Fourier transform circuit 108 transforms the output signal of the A/D converter circuit 107 from a time-domain signal to a frequency-domain signal. The demodulator 109 extracts data from the signal output from the fast Fourier transform circuit 108. Incidentally, when the received signal is a single carrier signal, the demodulator 109 extracts data from the output signal of the A/D converter circuit 107.

The voltage control transmitter 110 transmits a local signal of a frequency designated by the LO frequency controller 114. The frequency divider circuit 111 divides the frequency of the local signal transmitted from the voltage control transmitter 110 and outputs the resultant signal to the mixer circuit 104.

The RX controller 112 performs feedback control on the low-noise amplifier circuit 103, the variable gain amplifier circuit 105, and the filter circuit 106 such that the reception level of the output signal of the A/D converter circuit 107 becomes a predetermined threshold value in order to keep the reception quality constant. In particular, when the RX controller 112 is notified of the detection of an interference signal by the level comparator 113, the RX controller 112 changes the previously set RX control settings, for example, changes the gain settings of the low-noise amplifier circuit 103 and the variable gain amplifier circuit 105 and changes the cutoff frequency of the filter circuit 106.

From when the mode enters a reception mode until when a desired signal is received, the level comparator 113 extracts, from the signal output from the fast Fourier transform circuit 108, a portion that coincides with the frequency of the desired signal, detects the reception level thereof, and compares the reception level and a predetermined threshold value. Then, when the reception level is higher than the predetermined threshold value, the level comparator 113 determines that an interference signal exists and notifies the RX controller 112 of the detection of the interference signal. Moreover, when the reception level is lower than or equal to the predetermined threshold value, the level comparator 113 determines that an interference signal does not exist. Furthermore, the level comparator 113 notifies the LO frequency controller 114 of switching timing of the frequency of the local signal (LO).

The LO frequency controller 114 sets the frequency of the local signal (LO) transmitted from the voltage control transmitter 110. In particular, from when the mode enters a reception mode until when a desired signal is received, the LO frequency controller 114 switches the setting of the frequency of the local signal (LO) with the timing notified from the level comparator 113, such that the frequency of intermodulation distortion becomes an intermediate frequency of the frequency of the desired signal.

Figure 2:
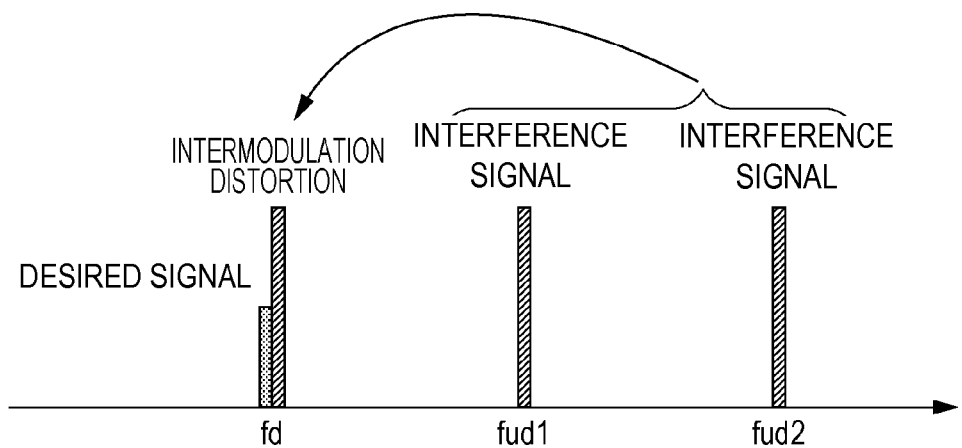
FIG. 2 is a diagram explaining intermodulation distortion.

Next, intermodulation distortion which becomes an interference signal will be described. The intermodulation distortion occurs when two radio waves pass through a nonlinear circuit. As depicted in FIG. 2, when this intermodulation distortion occurs in a desired signal or a frequency band near the desired signal, the intermodulation distortion becomes an interference signal for the desired signal. In particular, when multicarrier communication such as OFDM is performed near the desired signal, there is a high possibility that the intermodulation distortion acts as an interference signal.

The intermodulation distortion appears as odd-order distortion such as third-order intermodulation distortion, fifth-order intermodulation distortion, or seventh-order intermodulation distortion.

Figure 3:
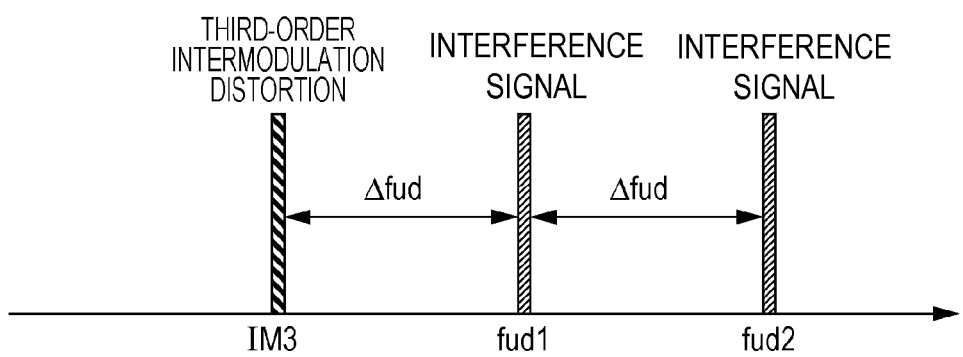
FIG. 3 is a diagram depicting the relationship between the frequencies at which third-order intermodulation distortion occurs.

FIG. 3 is a diagram depicting the relationship between the frequencies at which third-order intermodulation distortion occurs. The relationship between a frequency IM3 of third-order intermodulation distortion and frequencies fud1 and fud2 of two radio waves is expressed by the following Equation (1).

$$IM3=2fud1-fud2$$

$$IM3=2fud2-fud1 \qquad (1)$$

Moreover, when the difference between the frequencies fud1 and fud2 of the two radio waves is assumed to be Δfud, the frequency IM3 of the third-order intermodulation distortion is expressed by the following Equation (2).

$$IM3=fud1-(fud2-fud1)=fud1-\Delta fud \qquad (2)$$

Figure 4:
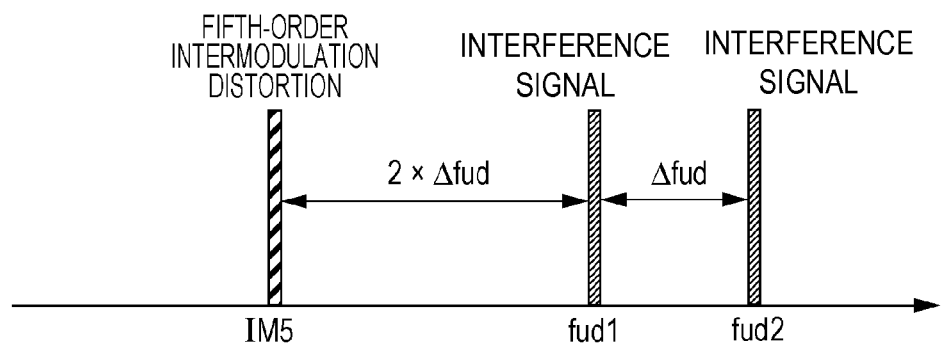
FIG. 4 is a diagram depicting the relationship between the frequencies at which fifth-order intermodulation distortion occurs.

FIG. 4 is a diagram depicting the relationship between the frequencies at which fifth-order intermodulation distortion occurs. The relationship between a frequency IM5 of fifth-order intermodulation distortion and the frequencies fud1 and fud2 of the two radio waves is expressed by the following Equation (3).

$$IM5=3fud1-2fud2$$

$$IM5=3fud2-2fud \qquad (3)$$

Moreover, when the difference between the frequencies fud1 and fud2 of the two radio waves is assumed to be Δfud, the frequency IM5 of the fifth-order intermodulation distortion is expressed by the following Equation (4).

$$IM5=fud1-2(fud2-fud1)=fud1-2\Delta fud \qquad (4)$$

Figure 5:
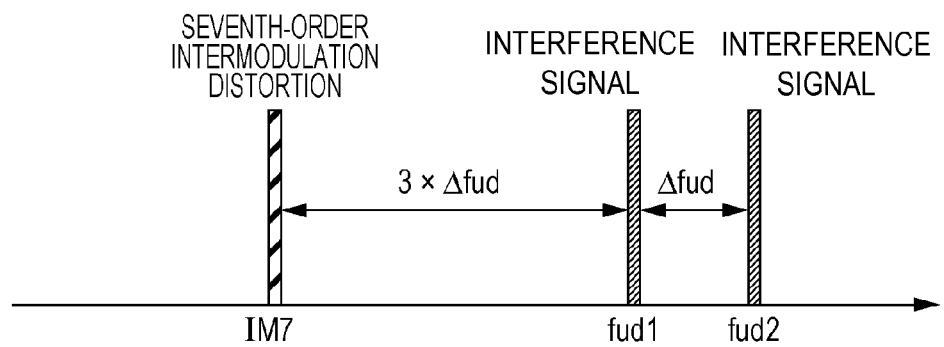
FIG. 5 is a diagram depicting the relationship between the frequencies at which seventh-order intermodulation distortion occurs.

FIG. 5 is a diagram depicting the relationship between the frequencies at which seventh-order intermodulation distortion occurs. The relationship between a frequency IM7 of seventh-order intermodulation distortion and the frequencies fud1 and fud2 of the two radio waves is expressed by the following Equation (5).

$$IM7=4fud1-3fud2$$

$$IM7=4fud2-3fud1 \qquad (5)$$

Moreover, when the difference between the frequencies fud1 and fud2 of the two radio waves is assumed to be Δfud, the frequency IM7 of the seventh-order intermodulation distortion is expressed by the following Equation (6).

$$IM7=fud1-3(fud2-fud1)=fud1-3\Delta fud \qquad (6)$$

For example, when wireless sensor networks is performed by using the 920 MHz band, when intermodulation distortions IM3, IM5, IM7 caused by the combination of the subcarriers of the OFDM signal which is transmitted at 945 to 960 MHz occur near the 920 MHz band, the occurrence of the intermodulation distortions IM3, IM5, IM7 affects the reception performance of the desired signal. The intermodulation distortions IM3, IM5, and IM7 are expressed by Equations (2), (4), and (6) described above.

Thus, in the present embodiment, the presence or absence of an interference signal is determined before reception of a desired signal, and, when an interference signal is present, the previously set RX control settings are changed and then desired signal reception processing is performed.

FIG. 6 is a flow diagram depicting the flow of preliminary processing of the radio communication apparatus 100 according to the present embodiment, the preliminary processing which is performed prior to the reception of a desired signal. Incidentally, in the radio communication apparatus, the number N (N is a natural number which is greater than or equal to 0) of interference signal frequencies is set in advance. For example, when N=2, a local signal fudLOm for an interference signal is changed two times.

In the flow of FIG. 6, when the radio communication apparatus 100 of FIG. 1 enters a reception mode, first, in ST601 and ST602, the LO frequency controller 114 sets, for the voltage control transmitter 110, the frequency of a first local signal fudLOm for an interference signal (m=1) which has been calculated in advance. The voltage control transmitter 110 transmits the local signal of the set frequency. The frequency divider circuit 111 divides the frequency of the local signal transmitted from the voltage control transmitter 110. Then, reception processing is performed from the antenna 101 to the fast Fourier transform circuit 108.

Next, in ST603 and ST604, the level comparator 113 detects the reception level of a frequency portion of a desired signal from the output of the fast Fourier transform circuit 108 and compares the reception level and a predetermined threshold value.

When the reception level of the frequency portion of the desired signal is lower than or equal to the threshold value (ST604: YES), the level comparator 113 determines that intermodulation distortion (an interference signal) by that frequency is not present. In this case, m=2 in ST605 and the flow proceeds to NO in ST606. Then, in ST602, the LO frequency controller 114 sets, for the voltage control transmitter 110, the frequency of the next local signal fudLOm for an interference signal (m=m+1). Then, when an interference signal is not detected, the processing from ST602 to ST606 is repeated until N+1=m. When N+1=m, the flow proceeds to ST608.

On the other hand, when the reception level is higher than the threshold value (ST604: NO), the level comparator 113 determines that intermodulation distortion (an interference signal) by that frequency is present, that is, an interference signal exists. In this case, in ST607, the RX controller 112 changes the previously set RX control settings, for example, changes the gain settings of the low-noise amplifier circuit 103 and the variable gain amplifier circuit 105 and changes the cutoff frequency of the filter circuit 106. After ST607, the flow proceeds to ST608.

In ST608, the LO frequency controller 114 sets, for the voltage control transmitter 110, the frequency of a local signal fdLO for a desired signal and ends the preliminary processing.

Then, the radio communication apparatus 100 performs desired signal reception processing from the antenna 101 to the demodulator 109. At that time, the RX controller 112 performs feedback control on the low-noise amplifier circuit 103, the variable gain amplifier circuit 105, and the filter circuit 106 in order to keep the reception quality constant.

As described above, according to the present embodiment, the level comparator 113 is added to the radio communication apparatus 100 to detect an interference signal. The level comparator 113 is smaller than a notch filter or the like in circuit size. Therefore, according to the present embodiment, it is possible to detect an interference signal without an increase in circuit size.

Since the present disclosure can detect an interference signal without an increase in circuit size, the present disclosure is suitably used in a radio communication apparatus or the like that performs radio communication using a constant envelope modulation scheme.

What is claimed is:

1. A radio communication apparatus comprising:
    a mixer that generates an analog signal of an intermediate frequency by mixing a local signal having a frequency with an analog signal of a radio frequency;
    an analog-to-digital converter that converts the generated analog signal of the intermediate frequency into a digital signal in a time-domain;
    a Fourier transformer that transforms the digital signal in the time-domain into a frequency-domain signal;
    a level comparator that, until when a desired signal is received in a reception mode, extracts a portion of the frequency-domain signal output from the Fourier transformer, the portion matching with a frequency of the desired signal, compares a reception level of the extracted portion with a threshold value, and determines whether or not an interference signal exists based on the comparison result; and
    a LO frequency controller that sets the frequency of the local signal based on the determination result such that a frequency of intermodulation distortion caused by the interference signal becomes an intermediate frequency of the frequency band of the desired signal, wherein the local signal of the frequency set by the LO frequency controller is output to the mixer during the reception mode.

2. The radio communication apparatus according to claim 1, wherein
    when the reception level of the extracted portion is higher than the threshold value, the level comparator determines that the interference signal exists.

3. The radio communication apparatus according to claim 1, further comprising:
    a low-noise amplifier circuit that performs variable amplification on the analog signal of the radio frequency and outputs the amplified analog signal to the mixer;
    a variable gain amplifier circuit that performs variable amplification on the analog signal of the intermediate frequency input from the mixer;
    a filter circuit that removes a high-frequency component from the amplified analog signal of the intermediate frequency input from the variable gain amplifier circuit and outputs to the analog-to-digital converter the amplified analog signal of the intermediate frequency from which the high-frequency component has been removed; and
    an RX controller that performs, when the level comparator determines that the interference signal exists, feedback control for changing gain settings of the low-noise amplifier circuit and gain settings of the variable gain amplifier circuit and for changing a cutoff frequency of the filter circuit.

4. An interference signal detection method comprising:
    generating an analog signal of an intermediate frequency by mixing a local signal having a frequency with an analog signal of a radio frequency;
    converting the generated analog signal of the intermediate frequency into a digital signal in a time-domain;

transforming the digital signal in the time-domain into a frequency-domain signal;

extracting a portion of the frequency-domain signal, the portion matching with a frequency of a desired signal, comparing a reception level of the extracted portion with a threshold value, and determining whether or not an interference signal exists based on the comparison result until when the desired signal is received in a reception mode; and setting the frequency of the local signal based on the determination result such that a frequency of intermodulation distortion caused by the interference signal becomes an intermediate frequency of the frequency band of the desired signal, wherein the local signal of the frequency set in the setting step is output during the reception mode.

* * * * *